United States Patent
Takahashi et al.

(10) Patent No.: US 7,473,670 B2
(45) Date of Patent: Jan. 6, 2009

(54) PROCESS FOR PRODUCING RARE EARTH OXIDE SUPERCONDUCTOR

(75) Inventors: Yasuo Takahashi, Kawasaki (JP); Yuji Aoki, Kawasaki (JP); Takayo Hasegawa, Kawasaki (JP)

(73) Assignees: International Superconductivity Technology Center (JP); The Juridical Foundation (JP); The Furukawa Electric Co., Ltd. (JP); SWCC Showa Cable Systems Co., Ltd. (JP)

(*) Notice: Subject to any disclaimer, the term of this patent is extended or adjusted under 35 U.S.C. 154(b) by 532 days.

(21) Appl. No.: 10/551,900

(22) PCT Filed: May 6, 2004

(86) PCT No.: PCT/JP2004/006406
§ 371 (c)(1),
(2), (4) Date: Oct. 4, 2005

(87) PCT Pub. No.: WO2004/100182
PCT Pub. Date: Nov. 18, 2004

(65) Prior Publication Data
US 2006/0258538 A1    Nov. 16, 2006

(30) Foreign Application Priority Data
May 7, 2003    (JP)    ............... 2003-129368
May 7, 2003    (JP)    ............... 2003-129369

(51) Int. Cl.
*H01L 39/24*    (2006.01)
*B05D 5/12*    (2006.01)
(52) U.S. Cl. .................... 505/470; 427/62
(58) Field of Classification Search .......... 505/237, 505/238, 239, 434, 440, 470, 818; 428/699–702, 428/930; 427/62, 126.3
See application file for complete search history.

(56) References Cited

U.S. PATENT DOCUMENTS 5,595,960 A * 1/1997 Belouet et al. .............. 505/473

(Continued)

FOREIGN PATENT DOCUMENTS

JP    11-111080 A    4/1999

(Continued)

OTHER PUBLICATIONS

Thiele et al "Grain boundaries in YBa2Cu3O7 films grown on bicrystalline Ni substrates", Physica C 355 (2001) 203-210.*

(Continued)

*Primary Examiner*—Mark Kopec
(74) *Attorney, Agent, or Firm*—Bacon & Thomas, PLLC

(57) ABSTRACT

RE superconductive layer of high critical current density (Jc) is superimposed on an interlayer formed so as to, while ensuring cracking prevention, excel in crystallinity, such as in-plane orientation degree and direction, and surface smoothness. On an oriented Ni substrate, there are sequentially superimposed an interlayer of cerium oxide loaded with 20 to 60 mol %, in terms of metal content, of one or at least two rare earth elements according to MOD technique and an RE superconductive layer of high Jc according to MOD technique. The above interlayer is formed by mixing a Gd, Y and/or Yb organometallic compound solution with a Ce organometallic compound solution, applying the mixed solution onto an oriented Ni substrate so as to form a coating film and subjecting the coating film to calcination heat treatment and thereafter firing in an Ar—$H_2$ atmosphere at 950 to 1150° C. under a pressure of 50 to 500 Pa. YBCO superconductive layer is formed on this interlayer according to TFA-MOD technique.

8 Claims, 1 Drawing Sheet

U.S. PATENT DOCUMENTS 6,649,570 B2 * 11/2003 Belouet .................. 505/237
2004/0157747 A1 * 8/2004 Chen et al. ............. 505/238

FOREIGN PATENT DOCUMENTS

| JP | 2002-75079 A | 3/2002 |
| JP | 2003-34527 A | 2/2003 |
| JP | 2003-323822 A | 11/2003 |

OTHER PUBLICATIONS

Wu et al "Epitaxial Layers and Bilayers of Ce Oxide . . . ", Proceedings of 6th Intl. Workshp. on Oxide Elect., College Park, Mdm Dec. 6-7, 1999 (Abstract Only).*

* cited by examiner

PROCESS FOR PRODUCING RARE EARTH OXIDE SUPERCONDUCTOR

TECHNICAL FIELD

The present invention relates to an oxide superconductor and a process for producing the same and, more particularly, it relates to a tape-form rare earth oxide superconductor (RE superconductor) suitable for using in instruments such as superconducting magnets and superconducting cables and the improvement in a process for producing the same.

BACKGROUND ART

Rare earth 123 superconductors (RE-123 superconductors) are excellent in magnetic field characteristics at liquid nitrogen temperature compared with Bi superconductors (Bi—Sr—Ca—Cu—O superconductors), therefore, it is possible to achieve a high critical current density (Jc) suitable for practical use under a high magnetic field. If a practical application of this wire material is successful, a production process without using silver, which is a noble metal, is possible as well as it has an excellent characteristic in a high temperature region, and liquid nitrogen can be used for a cooling medium thereby improving the cooling efficiency several tens-fold to several hundreds-fold; therefore, it is extremely advantageous from an economical standpoint. As a result, it becomes possible to apply a superconducting wire material to an instrument to which it could not be conventionally applied from an economical standpoint, and the use and the market of superconducting instruments are expected to be expanded to a large extent.

The crystal system of RE-123 superconductors (particularly Y-123 superconductors with the molar ratio of Y:Ba:Cu=1:2:3) is an orthorhombic crystal. Therefore, in order to exert the characteristics of the material in conducting characteristics, it is require to align not only the CuO planes of the crystal but also the in-plane crystal orientations. This is because only small misalignment of orientations generates bicrystal grain boundary and decreases the conducting characteristics.

A production process for fabricating a wire material while improving the in-plane orientation of the crystal in the above-mentioned Y-123 superconductor and aligning the directional property in the plane has the same constitution as that of a production process for a thin film. That is, by forming an intermediated layer in which the in-plane orientation and the directional property are improved on a tape-form metal substrate and using the crystal lattice of this intermediate layer as a template, the in-plane orientation and the directional property of the crystal in the Y-123 superconductor can be improved.

Further, the Jc of a superconductor depends on the crystallinity and the surface smoothness of an intermediate layer, and it has been found that its characteristics vary sensitively according to the condition of the substrate to a large extent.

As a technique for producing a biaxially textured metal substrate in which an in-plane aligned intermediate layer is formed on the above-mentioned tape-form metal substrate, SOE (surface-oxidation epitaxy) method, ISD (inclined substrate deposition) method, IBAD (ion beam assisted deposition) method and RABiTS (rolling assisted biaxially textured substrate) method are known, and many reports in which Y-123 superconducting wire material with a Jc of more than $10^6$ A/cm$^2$ is obtained by forming an intermediated layer in which the in-plane orientation and the directional property are improved on a non-textured or textured metal tape.

Among these, in the formation of an intermediate layer by the IBAD or RABiTS method, a vacuum process by a vapor phase method such as PLD (pulse laser deposition) method is used. In the IBAD method, a combination of Hastelloy/YSZ/$Y_2O_3$ is generally used as a biaxially textured metal substrate, on the other hand, in the RABiTS method, a combination of Ni/$CeO_2$/YSZ/$CeO_2$ or the like is generally used, and they have an advantage in that a dense and smooth intermediate layer film can be obtained (see, for example, Non-Patent Document 1).

As for materials of the above-mentioned intermediate layer, various investigations have been conducted, in particular, a $CeO_2$ intermediated layer has a good matching with the crystal lattice of a YBCO layer (Y—Ba—Cu—O superconducting layer) and has a small reactivity with the YBCO layer, therefore, it is known to be one of the most superior intermediate layers, and lots of results are reported.

As described above, in the case where a YBCO layer is formed on a metal substrate, $CeO_2$ has an excellent characteristic as an intermediate layer, however, a $CeO_2$ film has a problem in that a crack is liable to occur due to such as the difference in thermal expansion with the metal substrate, and the film cannot be made thick. For example, in the RABiTS method, YSZ (yttria-stabilized zirconia) is interposed in the intermediate layer on the surface of a textured Ni substrate, and as shown in FIG. 2, it was necessary that a $CeO_2$ film (11), a YSZ layer (12) and a $CeO_2$ film (13) are sequentially formed on the surface of a textured Ni substrate (10), and a YBCO layer (14) is formed thereon.

[Non-Patent Document 1]
A. Goyal et al., Physica C, 357-360 (2001) 903

DISCLOSURE OF THE INVENTION

The present invention has been made in order to solve the above-mentioned problems, and an object of the present invention is to provide an RE superconductor in which an intermediate layer which prevents the occurrence of a crack and is excellent in crystallinity such as in-plane orientation and directional property and surface smoothness is formed on a metal substrate so that a rare earth oxide superconducting layer (RE superconducting layer) which is excellent in superconducting characteristics is formed on this intermediate layer.

Another object of the present invention is to provide a process for producing an RE superconductor in which an intermediate layer which prevents the occurrence of a crack and is excellent in crystallinity such as in-plane orientation and directional property and surface smoothness is formed on a metal substrate by calcination under a pressure within a predetermined range at a temperature within a predetermined range so that an RE superconducting layer which is excellent in superconducting characteristics is formed on this intermediate layer.

BEST MODE FOR CARRYING OUT THE INVENTION

Figure 1:
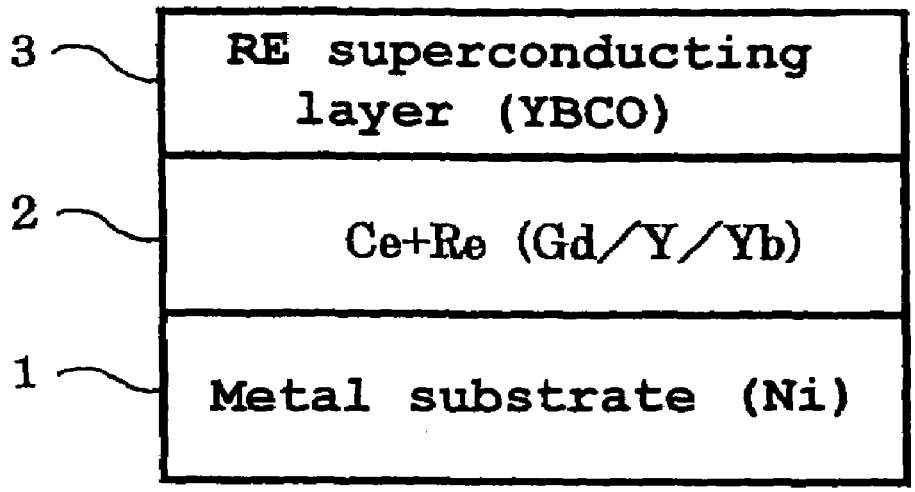
FIG. 1 is a cross sectional view showing one embodiment of an RE superconductor of a first aspect of the present invention.
Figure 2:
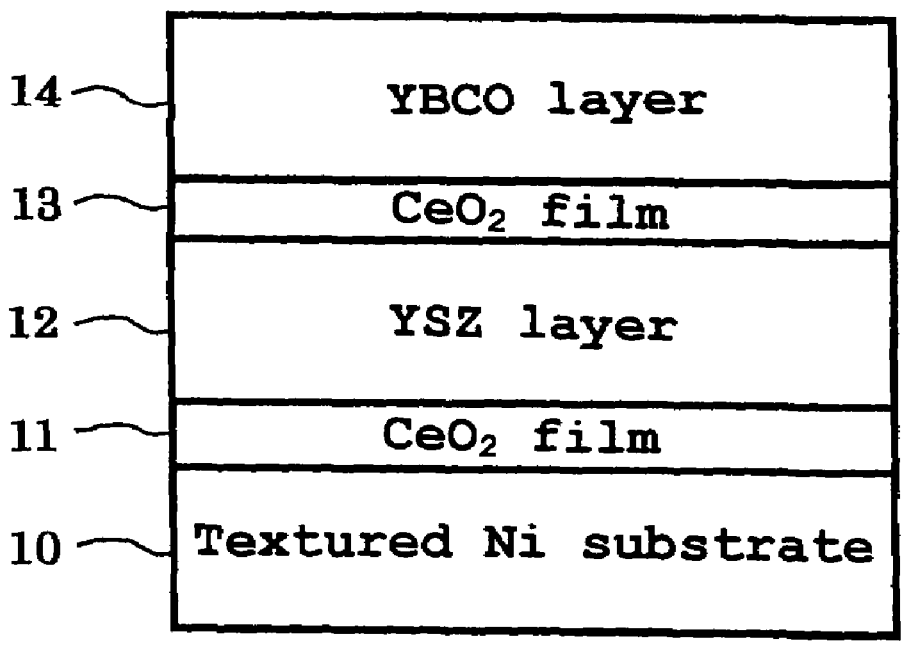
FIG. 2 is a cross-sectional view of a conventional rare earth oxide superconductor according to the RABiTS method.

In order to solve the above problems, an RE superconductor, which is a first aspect of the present invention, is the one in which an intermediate layer (2) comprising a cerium oxide obtained by adding 5 to 90 mol %, in terms of the metal content, of one or two or more elements selected from rare earth elements Re (Re represents any one of elements of Y, Nd, Sm, Gd, Eu, Yb, Ho, Tm, Dy, La and Er) to cerium is formed on a surface of a metal substrate (1), and an RE superconducting layer (3) is formed on this intermediate layer as shown in FIG. 1.

In addition, in order to solve the above problems, a process for producing an RE superconductor, which is a second aspect of the present invention, is the one in which an intermediate layer comprising a cerium oxide is formed by applying a mixture obtained by mixing 5 to 90 mol %, in terms of the metal content, of one or two or more elements selected from rare earth elements Re (Re represents any one of elements of Y, Nd, Sm, Gd, Eu, Yb, Ho, Tm, Dy, La and Er) with cerium on a surface of a metal substrate by a liquid phase process, and forming calcination at a temperature of 900° C. or higher and lower than 1200° C. under a reduced pressure of 0.1 Pa or higher and lower than atmospheric pressure, and then an RE superconducting layer is formed on this intermediate layer.

According to the RE superconductor of the present invention, by forming an intermediate layer on a metal substrate with a cerium oxide obtained by adding a predetermined amount of a specific rare earth element (Re), the occurrence of a crack in the intermediate layer can be prevented, and an intermediate layer excellent in crystallinity such as in-plane orientation and directional property as well as surface smoothness can be formed on a metal substrate. As a result, it becomes possible to form an RE superconducting layer excellent in superconducting characteristics on this intermediate layer.

In addition, according to a process for producing an RE superconductor of the present invention, an intermediate layer comprising a cerium oxide is formed on a surface of a metal substrate by applying a mixture obtained by mixing a predetermined amount of one or two or more elements selected from specific Res with cerium by a liquid phase process, and performing calcination at a temperature within a predetermined range under a controlled atmosphere, therefore the occurrence of a crack in an intermediate layer can be prevented, and an intermediate layer excellent in crystallinity such as in-plane orientation and directional property as well as surface smoothness can be formed on a metal substrate. As a result, it becomes possible to form an RE superconducting layer excellent in superconducting characteristics on this intermediate layer.

In the RE superconductor of the present invention and the process for producing the same, an intermediate layer obtained by adding Re to cerium is formed on a surface of a metal substrate (under a controlled atmosphere), and an RE superconducting layer is formed on this intermediate layer. This intermediate layer is required to have a low reactivity with a superconductor, a small proportion of the difference in distance of the crystal lattice (misfit) and a function of preventing diffusion of metal elements in the substrate. From this point of view, as a crystal structure suitable for the intermediate layer, any crystal structure of a fluorite structure, a rare earth C-type structure and a pyrochlore structure is selected. In addition, since the occurrence of a crack that occurred in the case of a monolayer of $CeO_2$ is suppressed by adding or including Re, the intermediate layer on a metal substrate can be a monolayer.

In the above case, the misfit between the lattice constant of the a-axis of Y-123 superconductor crystal (3.88 Å) and the above-mentioned oxide crystal lattice is 8% or less, however, this misfit varies depending on the composition, and if possible, it is preferred to be 1% or less.

The Re amount added to the intermediate layer in the first aspect as described above and the Re amount contained in the mixture in the second aspect is selected within the range from, in terms of the metal content, 5 to 90 mol %, preferably from 20 to 60 mol %.

It is because in the case where the Re content is low, the effect of preventing the occurrence of a crack is small, and when the Re content becomes high, the reactivity with YBCO layer and the metal substrate becomes high, thus the effect as an intermediate layer becomes small. In particular, the Re content exceeds 60 mol %, a different phase is liable to be deposited, whereby the surface smoothness is liable to be lost.

As the above-mentioned method of forming the intermediate layer in the first aspect, various film forming methods through a vapor phase process such as a physical vapor deposition method including PLD method, e-beam deposition, sputtering and the like, a chemical deposition method including chemical vapor deposition (CVD) and the like, IBAD method, which is a self-orientation process for an oxide and ISD method, or through a liquid phase process such as MOD (metal organic deposition; deposition by thermal decomposition of organometallic salt) method can be used, however, it is preferred to use MD method or PLD method in terms of the easiness of production and the production rate.

In addition, as the above-mentioned method of forming the intermediate layer in the second aspect, various film forming methods through a liquid phase process can be used, however, MOD method is adopted in terms of the easiness of production and the production rate.

The above-mentioned MD method is known as a production method using a non-vacuum process. In the case of the present invention, after a mixed solution of metal organic acid salts of Ce and Re such as a trifluoroacetic acid salt (a TFA salt), an octylic acid salt and a naphthenic acid salt containing each metal element constituting the intermediate layer at a predetermined molar ratio is coated on a substrate, calcination is performed.

Calcination of the intermediate layer by the MOD method is performed under a reduced pressure of 0.1 or higher and less than atmospheric pressure (e.g., 800 Pa), and in particular, by performing calcination at a pressure ranging from 10 to 500 Pa, crystallization temperature can be decreased, whereby calcination of the intermediate layer at a low temperature of 1000° C. or lower becomes possible. In the case of using a metal tape as a substrate, this is effective in terms of decreasing the rate of diffusing metal elements in the substrate into the inside of the intermediate layer. In calcination at less than 0.1 Pa, random crystallization occurs before a film epitaxially grows, therefore, the orientation of the intermediate layer is significantly decreased. Further, a pressure ranging from 50 to 500 Pa is preferably adopted.

As for the calcination temperature of the intermediate layer, the calcination is performed at a temperature of 900° C.

or higher and lower than 1200° C. It is because in the case where the calcination temperature is lower than 900° C., it becomes difficult to obtain a biaxially textured film, and in the case where the calcination temperature is 1200° C. or higher, a film is decomposed during the calcination, and it becomes difficult to obtain a desired oxide. In particular, the calcination temperature of the intermediate layer is preferably in the range from 950 to 1150° C.

As the metal substrate, a biaxially textured metal tape made of Ni, Ag, an alloy thereof such as Ni—V alloy or Ni—W alloy, or the like, a non-textured metal tape made of Ni, Ag or an alloy thereof, or a heat resistant alloy such as SUS, Hastelloy or Inconel can be used.

In the case where the intermediate layer is formed on the metal substrate, all the methods described as the method of forming the above-mentioned intermediate layer can be applied to a textured metal tape, and IBAD method and ISD method are applied to a non-textured metal tape in which the substrate itself does not have orientation. As mentioned above, in the case where the intermediate layer is formed by MOD method or PLD method, it is preferred to use a metal substrate with high orientation as the metal substrate.

In addition, in the case where the intermediate layer is directly formed on the metal substrate made of Ni or a Ni alloy, as for the atmosphere during calcination, it is preferred to use a reducing gas atmosphere in which $H_2$ is added at 0.1 to 10% to an Ar and $N_2$ gas mixture. It is because in the case where a film is formed in an atmosphere having an $H_2$ concentration of less than 0.1%, NiO is produced on the Ni surface and the epitaxial growth of the intermediate layer film is significantly inhibited, and in the case where the $H_2$ concentration exceeds 10%, the reducing ability of the gas becomes too strong, therefore it becomes difficult to obtain a desired oxide.

As described above, an orientation controlling and diffusion preventing layer with thickness of 0.2 μm or less obtained by forming a film using a vapor phase process such as PLD method or a sputtering method can be provided between the intermediate layer formed by MOD method and the metal tape. Further, it is effective that the surface smoothness is improved by forming a $CeO_2$, Ce—Re—O film with thickness of 0.2 μm or less by PLD or a sputtering method as a CAP layer on the intermediate layer formed by MOD method.

In addition, the number of coating a precursor film of the intermediate layer film on the surface of the metal substrate by MOD method is by no means limited, and a technique in which a treatment of coating and preliminary calcination (drying) is performed plural times can be adopted for obtaining a desired film thickness.

As the method of forming a superconducting layer on the intermediate layer formed on the metal substrate as described above, various methods such as a film forming method through a vapor phase process such as a physical vapor deposition method including PLD method, e-beam deposition and the like, a chemical vapor deposition method including CVD method and the like, or through a liquid phase process such as MOD method in the same manner as for the intermediate layer can be used and the film can be formed.

In particular, among the above-mentioned methods of forming a superconducting layer, the intermediate layer according to the present invention is very effective in a method in which a precursor obtained by preliminary calcination of TFA (TFA-MOD method) or a precursor containing F in such as e-beam or PLD method (ex-situ method) is coated on the surface of a tape to form a film, and actual calcination of the obtained film is performed to form a YBCO film. In these processes, since F is contained in the precursor film and water vapor is used during calcination, HF is generated during the preliminary calcination and the actual calcination, therefore the acid resistance of the intermediate layer becomes the issue. However, the intermediate layer according to the present invention is a Ce-based oxide, therefore, it is excellent in acid resistance.

In the intermediate layer according to the present invention, since the occurrence of a crack can be prevented, the film can be made thick, and it is not necessary to form the intermediate layer with a multilayer structure interposing a YSZ layer as in the above-mentioned RABiTS method, and an RE superconducting layer can be directly formed on a cerium oxide layer.

Hereunder, the present invention will be described with reference to Examples and Comparative Examples.

EXAMPLES 1 TO 4

Mixed solutions of Ce—Gd, Ce—Y, Ce—Yb and Ce—Gd—Yb were prepared, respectively by using each naphthenic acid solution containing 0.2 mol/L of Ce, Gd, Y or Yb. This mixed solution was coated on a {100}<001> textured Ni substrate with a size of 10 mm×5 mm by a spin coating method, whereby a coating film was formed. The rotating speed at this time was set to 3,000 rpm. The substrate coated with this coating film was subjected to a preliminary calcination heat treatment at 200° C. for 15 minutes in the atmosphere, and further subjected to calcination at 1,000° C. for 1 hour in an atmosphere of Ar—$H_2$ (2%), whereby an intermediate layer was formed.

Subsequently, a YBCO (Y-123) superconducting layer was formed on the above-mentioned intermediate layer by MOD method (TFA-MOD) using a trifluoroacetic acid salt. The superconducting layer was formed by applying a mixed solution of a trifluoroacetic acid salt containing each element of Y, Ba or Cu at a predetermined ratio to the intermediate layer, then subjecting the layer to a preliminary calcination heat treatment at 250° C. for 15 hours in an oxygen atmosphere containing water vapor, and then subjecting the layer to calcination at 760 to 800° C. for 1 to 3 hours in an oxygen atmosphere of Ar—$O_2$ (500 to 1,000 ppm) containing water vapor.

The in-plane orientation and presence or absence of the occurrence of a crack for the intermediate layer formed as described above, the orientation and presence or absence of the occurrence of a crack for the YBCO layer after YBCO film formation, the peak intensity and Jc for the intermediate layer are shown in Table 1 as well as the composition ratio of each mixed solution.

TABLE 1

| | | Composition ratio (mol %) | | | | Intermediate layer | | After YBCO film formation (TFA-MOD method) | | | |
|---|---|---|---|---|---|---|---|---|---|---|---|
| | | Ce | Gd | Y | Yb | In-plane orientation | Presence or absence of a crack | Orientation of YBCO | Presence or absence of a crack | Peak intensity of intermediate layer (CPS) | Jc (MA/cm$^2$) |
| Example | 1 | 55 | 45 | | | good | absent | good | absent | 11000 | 1.3 |
| | 2 | 70 | | 30 | | good | absent | good | absent | 10000 | 1 |
| | 3 | 60 | | | 40 | good | absent | good | absent | 8000 | 0.9 |
| | 4 | 70 | 25 | | 5 | good | absent | good | absent | 11500 | 1.2 |
| Comparative Example | 1 | 100 | | | | good | present | good | present | 3000 | 0.05 |
| | 2 | | | 100 | | good | absent | non | absent | 500 | 0 |

COMPARATIVE EXAMPLES 1 TO 2

An intermediate layer and a superconducting layer were formed on the textured Ni substrate in the same manner as in Example 1 except that a solution of naphthenic acid containing 0.2 mol/L of Ce or Y as a raw material solution of the intermediate layer was used. The results are shown in Table 1 in the same way.

EXAMPLES 5 TO 8

An intermediate layer was formed on a {100}<001> textured Ni substrate by PLD method by using as a target each of sintered bodies of Ce—Gd—O, Ce—Y—O and Ce—Yb—O obtained by adding Gd, Y or Yb to Ceo$_2$. The film forming conditions at this time were as follows: a Kr—F excimer laser at a wavelength of 248 nm was used, the temperature of the substrate was set from 500 to 800° C. in an atmosphere of Ar—H$_2$ (1 to 4%), and the pressure during the film formation was set from 0.1 to 500 mTorr.

The formation of a superconducting layer on the intermediate layer was performed in the same manner as in Examples 1 to 4.

The in-plane orientation and presence or absence of the occurrence of a crack for the intermediate layer formed as described above, the orientation and presence or absence of the occurrence of a crack for the YBCO layer after YBCO film formation, the peak intensity and Jc for the intermediate layer are shown in Table 2 as well as the composition ratio of each sintered body.

TABLE 2

| | | Composition ratio (mol %) | | | | Intermediate layer | | After YBCO film formation (TFA-MOD method) | | | |
|---|---|---|---|---|---|---|---|---|---|---|---|
| | | Ce | Gd | Y | Yb | In-plane orientation | Presence or absence of a crack | Orientation of YBCO | Presence or absence of a crack | Peak intensity of intermediate layer (CPS) | Jc (MA/cm$^2$) |
| Example | 5 | 55 | 45 | | | good | absent | good | absent | 13000 | 1.7 |
| | 6 | 80 | | 20 | | good | absent | good | absent | 10000 | 1.2 |
| | 7 | 55 | | | 45 | good | absent | good | absent | 9500 | 1 |
| | 8 | 70 | 30 | | | good | absent | good | absent | 11500 | 1.5 |
| Comparative Example | 3 | 100 | | | | good | present | good | present | 5000 | 0.05 |
| | 4 | | | 100 | | good | absent | non | absent | 500 | 0 |

COMPARATIVE EXAMPLES 3 TO 4

An intermediate layer and a superconducting layer were formed in the same manner as in Examples 5 to 8 except that $CeO_2$ or Y sintered body was used as a target.

The results are shown in Table 2 in the same way.

As is clear from the results of Examples and Comparative Examples above, in the RE superconductor obtained by forming an intermediate layer comprising a cerium oxide layer by MOD method or PLD method and then forming an RE superconducting layer on this intermediate layer by MOD method, a crack does not occur in the intermediate layer, the orientation of the intermediate layer and the superconducting layer is superior, and it shows a high Jc value. On the other hand, in the case where an oxide layer made of Ce or Y is used for an intermediate layer, due to the occurrence of a crack in the intermediate layer or the low orientation of the superconducting layer, either case results in showing an extremely low Jc value.

EXAMPLES 9 TO 17

Each solution of an organometallic compound of Ce, Gd, Y or Yb at a metal concentration of 0.2 mol/L was prepared, and a mixed solution having a metal molar ratio shown in Table 3 was prepared. This mixed solution was coated on the textured Ni substrate with a size of 10 mm×5 mm by a spin coating method, whereby a coating film was formed.

TABLE 3

| | Material of Ce | | Material of Gd | | Material of Y | | Material of Yb | |
|---|---|---|---|---|---|---|---|---|
| | Organic group | mol % | Organic group | Metal concentration mol % | Organic group | Metal concentration mol % | Organic group | Metal concentration mol % |
| Example 9 | naphthenic acid | 50 | naphthenic acid | 50 | | | | |
| 10 | octylic acid | 60 | naphthenic acid | 20 | octylic acid | 20 | | |
| 11 | neodecanoic acid | 40 | neodecanoic acid | 30 | neodecanoic acid | 15 | neodecanoic acid | 15 |
| 12 | naphthenic acid | 55 | naphthenic acid | 45 | | | | |
| 13 | naphthenic acid | 20 | naphthenic acid | 80 | | | | |
| 14 | octylic acid | 20 | octylic acid | 45 | | | octylic acid | 35 |
| 15 | naphthenic acid | 30 | | | naphthenic acid | 40 | naphthenic acid | 30 |
| 16 | neodecanoic acid | 50 | neodecanoic acid | 25 | | | neodecanoic acid | 25 |
| 17 | octylic acid | 50 | octylic acid | 50 | | | | |
| Comparative Example 5 | naphthenic acid | 100 | | | | | | |
| 6 | | | octylic acid | 100 | | | | |
| 7 | | | | | octylic acid | 100 | | |
| 8 | naphthenic acid | 50 | naphthenic acid | 50 | | | | |
| 9 | octylic acid | 50 | naphthenic acid | 50 | | | | |

The rotating speed at this time was set to 3,000 rpm. The substrate with this coating film was subjected to a preliminary calcination heat treatment, and then subjected to calcination at a temperature ranging from 900 to 1150° C. in an atmosphere of Ar—$H_2$ (2%) at a pressure ranging from 10 to 500 Pa, whereby an intermediate layer with a film thickness of 100 to 600 nm was formed on the textured Ni substrate. The calcination temperature, the pressure during calcination and the film thickness of each Example are shown in Table 4.

TABLE 4

| | Calcination temperature (° C.) | Pressure during calcination (Pa) | Film thickness (nm) | CAP layer | Intermediate layer Orientation (%) | Intermediate layer Presence or absence of a crack | Peak intensity of intermediate layer (CPS) During production | Peak intensity of intermediate layer (CPS) After YBCO film formation | Jc (MA/cm$^2$) |
|---|---|---|---|---|---|---|---|---|---|
| Example 9 | 1000 | 100 | 200 | absent | 98 | absent | 5500 | 5200 | 1.8 |
| 10 | 1050 | 50 | 200 | absent | 95 | absent | 5000 | 4800 | 1.2 |
| 11 | 950 | 200 | 600 | present | 90 | absent | 5800 | 5500 | 1 |
| 12 | 1100 | 500 | 300 | absent | 97 | absent | 6500 | 6300 | 1.9 |

TABLE 4-continued

| | Pressure | | | | Intermediate layer | | Peak intensity of intermediate layer (CPS) | | |
| | Calcination temperature (° C.) | during calcination (Pa) | Film thickness (nm) | CAP layer | Orientation (%) | Presence or absence of a crack | During production | After YBCO film formation | Jc (MA/cm$^2$) |
|---|---|---|---|---|---|---|---|---|---|
| 13 | 1050 | 30 | 400 | present | 93 | absent | 4800 | 4200 | 0.9 |
| 14 | 1000 | 10 | 400 | present | 90 | absent | 4500 | 4400 | 1 |
| 15 | 900 | 500 | 500 | absent | 85 | absent | 4800 | 4150 | 0.9 |
| 16 | 1150 | 100 | 150 | absent | 94 | absent | 5800 | 5800 | 1.1 |
| 17 | 1000 | 80 | 100 | absent | 99 | absent | 7000 | 6950 | 1.1 |
| Comparative Example 5a | 1000 | 1.01E+05 | 100 | absent | 99 | present | 4000 | 400 | 0 |
| 5b | 1000 | 100 | 100 | absent | 97 | present | 4500 | 500 | 0 |
| 6 | 1100 | 1.01E+05 | 300 | absent | 92 | absent | 3000 | 750 | 0 |
| 7 | 1050 | 100 | 200 | absent | 95 | absent | 2500 | 300 | 0 |
| 8a | 800 | 150 | 200 | absent | 90 | absent | 2200 | 800 | 0 |
| 8b | 1000 | 1.01E+05 | 200 | absent | 96 | absent | 2500 | 950 | 0 |
| 8c | 1000 | 1.01E+05 | 200 | present | 99 | absent | 2500 | 1100 | 0.2 |
| 9 | 1200 | 100 | 200 | absent | 0 | absent | 200 | 150 | 0 |

In Table 4, 1.0E+0.5 Pa means 1.01×10$^5$ Pa, namely, indicates the atmospheric pressure.

Subsequently, a YBCO (Y-123) superconducting layer was formed on the above-mentioned intermediate layer by ND method (TFA-MOD) using a trifluoroacetic acid salt.

The superconducting layer was formed by applying a mixed solution of a trifluoroacetic acid salt containing each element of Y, Ba or Cu at a predetermined ratio to the intermediate layer, then subjecting the layer to a preliminary calcination heat treatment at 250° C. for 15 hours in an oxygen atmosphere containing water vapor, and then subjecting the layer to calcination at 740 to 800° C. for 1 to 3 hours in an oxygen atmosphere of Ar—O$_2$ (500 to 1,000 ppm) containing water vapor.

Incidentally, in the above-mentioned Examples, the one having a CAP layer on the intermediate layer was obtained by forming a CeO$_2$ film (with a film thickness of 0.05 μm) by PLD method on the intermediate layer formed by MOD method.

The in-plane orientation and presence or absence of the occurrence of a crack for the intermediate layer of the Re superconductor produced as described above, the peak intensity, and Jc for the intermediate layer are shown in Table 4 at the same time.

As is cleat from the results of Examples above, according to the process of the present invention, the occurrence of a crack is not observed in the intermediate layer and a good orientation is obtained, which does not depend on the type of organic acid salt used as a raw material.

In addition, the change in peak intensities of the intermediate layer due to YBCO film formation is hardly observed, the YBCO layer and the intermediate layer are chemically stable, and it is clear that it can be applied as a reaction preventing layer. Further, as for the Jc value, a high value can be obtained under all the conditions.

COMPARATIVE EXAMPLES 5 TO 9

Each solution of an organometallic compound of Ce, Gd or Y at a metal concentration of 0.2 mol/L was prepared, and a coating film was formed on the textured Ni substrate in the same manner as in Examples 9 to 17 using the respective solutions of organometallic compounds of Ce, Gd and Y and a mixed solution of Ce—Gd as shown in Table 3.

Thereafter, in the same manner as in the above-mentioned Examples, a preliminary calcination heat treatment and calcination were performed for the substrate with this coating film, whereby an intermediate layer with a film thickness of 100 to 300 nm was formed on the textured Ni substrate. The calcination temperature, the pressure during calcinations, and the film thickness of each Comparative Example are shown in Table 4.

Subsequently, in the same manner as in Examples, a YBCO (Y-123) superconducting layer was formed on the above-mentioned intermediate layer by TFA-MOD method.

The in-plane orientation and presence or absence of the occurrence of a crack for the intermediate layer of the RE superconductor produced as described above, the peak intensity, and Jc for the intermediate layer are shown in Table 4 at the same time.

As is clear from the results of Comparative Examples above, in the CeO$_2$ monolayer (Comparative Example 5), a crack occurs in the intermediate layer, and the peak intensity of the intermediate layer is significantly decreased after YBCO film formation, therefore, it does not show a Jc value.

In addition, as for the Gd$_2$O$_3$ monolayer (Comparative Example 6) or the Y$_2$O$_3$ monolayer (Comparative Example 7), the intermediate layer and the preliminary calcined YBCO film were reacted during the actual calcination of YBCO and the YBCO film does not grow, and the peak of the intermediate layer is decreased to a large extent, therefore, it does not show a Jc value.

Further, when the calcination temperature of the intermediate layer or the pressure during calcination deviates from the range of the present invention (Comparative Examples 5a, 6, 8b and 8c), the intermediate layer does not grow up to the surface, and YBCO is not aligned, therefore it does not show a Jc value or it will be an extremely low value. When the calcination temperature of the intermediate layer is 1200° C. (Comparative Example 9), the intermediate layer itself is decomposed, and it does not show a Jc value.

INDUSTRIAL APPLICABILITY

A rare earth oxide superconductor and a process for producing the same according to present invention is useful in a tape-form rare earth oxide superconductor suitable for using in instruments such as superconducting magnets and superconducting cables.

The invention claimed is:

1. A process for producing a rare earth oxide superconductor, comprising:

mixing cerium with 5 to 90 mol %, in terms of the metal content, of at least one rare earth element Re selected from the group consisting of Y, Nd, Sm, Gd, Eu, Yb, Ho, Tm, Dy, La and Er;

applying the mixture onto a surface of a metal substrate by liquid phase, metal organic deposition;

calcining the applied mixture at a temperature of 900° C. or higher and lower than 1200° C. under a reduced pressure of 0.1 Pa or higher and lower than atmospheric pressure to form an intermediate layer comprising a cerium oxide; and then forming a rare earth oxide superconducting layer on the intermediate layer.

2. The process for producing a rare earth oxide superconductor according to claim 1, wherein the content of the rare earth element Re in the mixture is 20 to 60 mol %, in terms of the metal content.

3. The process for producing a rare earth oxide superconductor according to claim 1, wherein the intermediate layer is formed by calcination under a pressure ranging from 50 to 500 Pa.

4. The process for producing a rare earth oxide superconductor according to claim 1, wherein the intermediate layer is formed by calcination at a temperature ranging from 950 to 1150° C.

5. The process for producing a rare earth oxide superconductor according to claim 1, wherein metal substrate is a biaxially textured metal substrate.

6. The process for producing a rare earth oxide superconductor according to claim 1, wherein the rare earth oxide superconducting layer is directly formed on the intermediate layer.

7. The process for producing a rare earth oxide superconductor according to claim 1 wherein the calcining is at a temperature of 950-1150° C.

8. A process for producing a rare earth oxide superconductor, comprising:

mixing cerium with 20 to 60 mol %, in terms of metal content, of at least one rare earth element Re selected from the group consisting of Y, Nd, Sm, Gd, Eu, Yb, Ho, Tm, Dy, La and Er;

applying the mixture onto a surface of a biaxially textured metal substrate by metal organic deposition;

calcining the applied mixture and in a reducing gas atmosphere containing 0.1 to 10% $H_2$, Ar and $N_2$, at a temperature from 950 to 1150° C. and under a pressure from 50 to 500 Pa, to form an intermediate layer comprising a cerium oxide; and then forming a rare earth oxide superconducting layer on the intermediate layer.

* * * * *